(12) United States Patent
Melanson

(10) Patent No.: US 7,429,940 B2
(45) Date of Patent: Sep. 30, 2008

(54) DELTA-SIGMA MODULATOR CIRCUIT WITH LIMITER AND METHOD THEREFOR

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/687,259

(22) Filed: Mar. 16, 2007

(65) Prior Publication Data

US 2007/0152858 A1 Jul. 5, 2007

Related U.S. Application Data

(63) Continuation of application No. 11/297,011, filed on Dec. 8, 2005, now Pat. No. 7,209,067.

(51) Int. Cl.
*H03M 3/00* (2006.01)

(52) U.S. Cl. ...................... 341/143; 341/144

(58) Field of Classification Search .................. 341/143, 341/118, 155, 139, 144
See application file for complete search history.

(56) References Cited

U.S. PATENT DOCUMENTS

| | | | |
|---|---|---|---|
| 5,708,433 A * | 1/1998 | Craven | 341/144 |
| 5,805,093 A * | 9/1998 | Heikkila et al. | 341/143 |
| 5,815,102 A | 9/1998 | Melanson | |
| 6,150,969 A | 11/2000 | Melanson | |
| 6,373,334 B1 | 4/2002 | Melanson | |
| 6,476,745 B1 * | 11/2002 | Evans et al. | 341/139 |
| 6,489,901 B1 | 12/2002 | Venkitachalam et al. | |
| 6,693,571 B2 | 2/2004 | Melanson et al. | |
| 6,697,004 B1 | 2/2004 | Galton et al. | |
| 6,724,332 B1 | 4/2004 | Melanson | |
| 6,727,832 B1 | 4/2004 | Melanson | |

(Continued)

FOREIGN PATENT DOCUMENTS

EP 0450984 A2 10/1991

OTHER PUBLICATIONS

Office Action in U.S. Appl. No. 11/297,011 mailed Sep. 22, 2006.

(Continued)

*Primary Examiner*—Jean B. Jeanglaude
*Assistant Examiner*—Joseph Lauture
(74) *Attorney, Agent, or Firm*—Andrew M. Harris; Mitch Harris, Atty at Law, LLC

(57) ABSTRACT

A delta-sigma modulator circuit with limiter and method provide extended dynamic range in noise-shaped pulse generators. A limiting circuit is provided to adjust the output of the quantizer of the delta-sigma modulator according to a given range of values. The range is adjusted in conformity with a stored previous value of the output of the limiter. The circuit permits adjustment of pulse widths in a consecutive-edge modulator (CEM) to correct conditions where a minimum high-state or low-state pulse width would be violated by the commanded output value of the quantizer. The adjusting circuit delays the rising edge of the next pulse if the minimum low state pulse width would not be met and/or extends the falling edge portion of the next pulse if the minimum high-state pulse width would not be met.

20 Claims, 4 Drawing Sheets

U.S. PATENT DOCUMENTS

| | | |
|---|---|---|
| 6,738,004 B2 | 5/2004 | Melanson |
| 6,744,392 B2 | 6/2004 | Melanson |
| 6,816,100 B1 | 11/2004 | Galton |
| 6,885,330 B2 | 4/2005 | Trotter et al. |
| 6,965,335 B1 | 11/2005 | Trotter et al. |
| 6,967,607 B2 | 11/2005 | Melanson |
| 7,006,028 B2 | 2/2006 | Galton |
| 7,209,067 B1 | 4/2007 | Melanson et al. |

OTHER PUBLICATIONS

Craven, Toward the 24-bit DAC: Novel Noise-Shaping Topologies Incorporating Correction for the Nonlinearity in a PWM Output Stag, Journal of the AES, May 1993, pp. 291-313, vol. 41, No. 5, Publisher: Audio Engineering Society, Published in : US.

Vankka, et al., A GSM/EDGE/WCDMA Modulator With On-Chip D/A Converter for Base Stations, IEEE Transactions on Circuits and Systems—II: Analog and Digital Signal Processing, Oct. 2002, pp. 645-655, vol. 49, No. 10, Publisher: IEEE , Published in: US.

* cited by examiner

DELTA-SIGMA MODULATOR CIRCUIT WITH LIMITER AND METHOD THEREFOR

This application is a Continuation of U.S. patent application Ser. No. 11/297,011, filed Dec. 8, 2005 now U.S. Pat. No. 7,209,067, and therefore Claims benefits under 35 U.S.C. §120.

BACKGROUND OF THE INVENTION

1. Field of the Invention

The present invention relates generally to pulse modulators, and more specifically, to a consecutive edge modulator having an extended dynamic range.

2. Background of the Invention

Consecutive edge modulators (CEMs) are desirable in applications such as digital-to-analog (D/A) converters and power output circuits due to the effectively doubled control update rate per pulse. Since the pulse output is controlled with respect to both the leading edge and the trailing edge, the control function is more responsive, leading to a lower operating frequency for a given required response.

In particular, in applications requiring a highly stable and accurate output, the CEM output circuit is driven by a noise-shaping modulator that pushes the conversion "noise" due to the discrete nature of the CEMs transfer function to the high end of the frequency spectrum, where the output filters can effectively remove the noise.

In switching circuits, and in particular power output circuits, a minimum pulse width generally must be enforced for both the positive portion and negative portion of pulses. Since the transition time for power devices is typically relatively long, for best performance, the minimum pulse widths are set to values substantially in excess of the sum of the switch transition times.

With any pulse modulation circuit, it is typically necessary, albeit undesirable, to limit the dynamic range of the pulse output, as the reduction results in a loss of control range. In particular, in noise-shaped circuits, the limitation on dynamic range is further exacerbated by the natural range of variation in the noise-shaping modulator output, which removes additional dynamic range due to the margins required to maintain linear operation and to maintain the minimum pulse widths. The minimum pulse widths must be maintained while the pulse width varies with both the quiescent pulse width due to the input level and additional variations due to the noise-shaping.

Therefore, it would be desirable to provide a noise-shaped CEM method and apparatus that provide operation over a wider dynamic range without violating the minimum pulse widths.

SUMMARY OF THE INVENTION

The above stated objectives are achieved in a method and apparatus for generating a limited modulator output. The method is a method of operation of the apparatus.

The apparatus includes a delta-sigma noise-shaping modulator, which may provide input to a CEM modulator. The CEM modulator permits a wider range of control output from the noise-shaping modulator resulting in wider possible pulse portion widths. Minimum pulse width requirements are observed by storing the position of previous edges and generating exceptions to the pulse widths commanded by the output of the noise-shaping modulator to ensure the minimum low and high state pulse widths are met. The pulse rising edge and falling edge portion widths can thereby be extended across 100% of their respective windows and in some embodiments of the invention, permitted to exceed 100% of the window.

The apparatus can include a numerical comparator or counter that determines when the modulation from the noise-shaper commands a rising and/or falling edge portion width that violates the minimum pulse width requirements and overrides the commanded modulation to delay the rising edge of the rising edge portion of the next pulse and/or extends the falling edge portion of the next pulse to produce the required minimum pulse widths.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and apparatus for producing a consecutive edge modulated (CEM) signal having an extended dynamic range. The dynamic range is extended by "borrowing" time from adjacent pulses while, ensuring that minimum pulse widths are met in the prescribed pulse windows or close to the expected pulse window in the case of one embodiment of the invention that provides for "extreme borrowing." The term borrowing from another pulse indicates that either a previous pulse is relied upon to supply some or all of the required high or low state pulse minimum width or a subsequent pulse is modified to ensure that a minimum pulse width is met. The present invention is particularly applicable to noise-shaped CEM modulators, as the output of the noise-shaping filter makes it unlikely that borrowing will be requested frequently and highly unlikely that borrowing will be requested for adjacent pulses.

Figure 1:
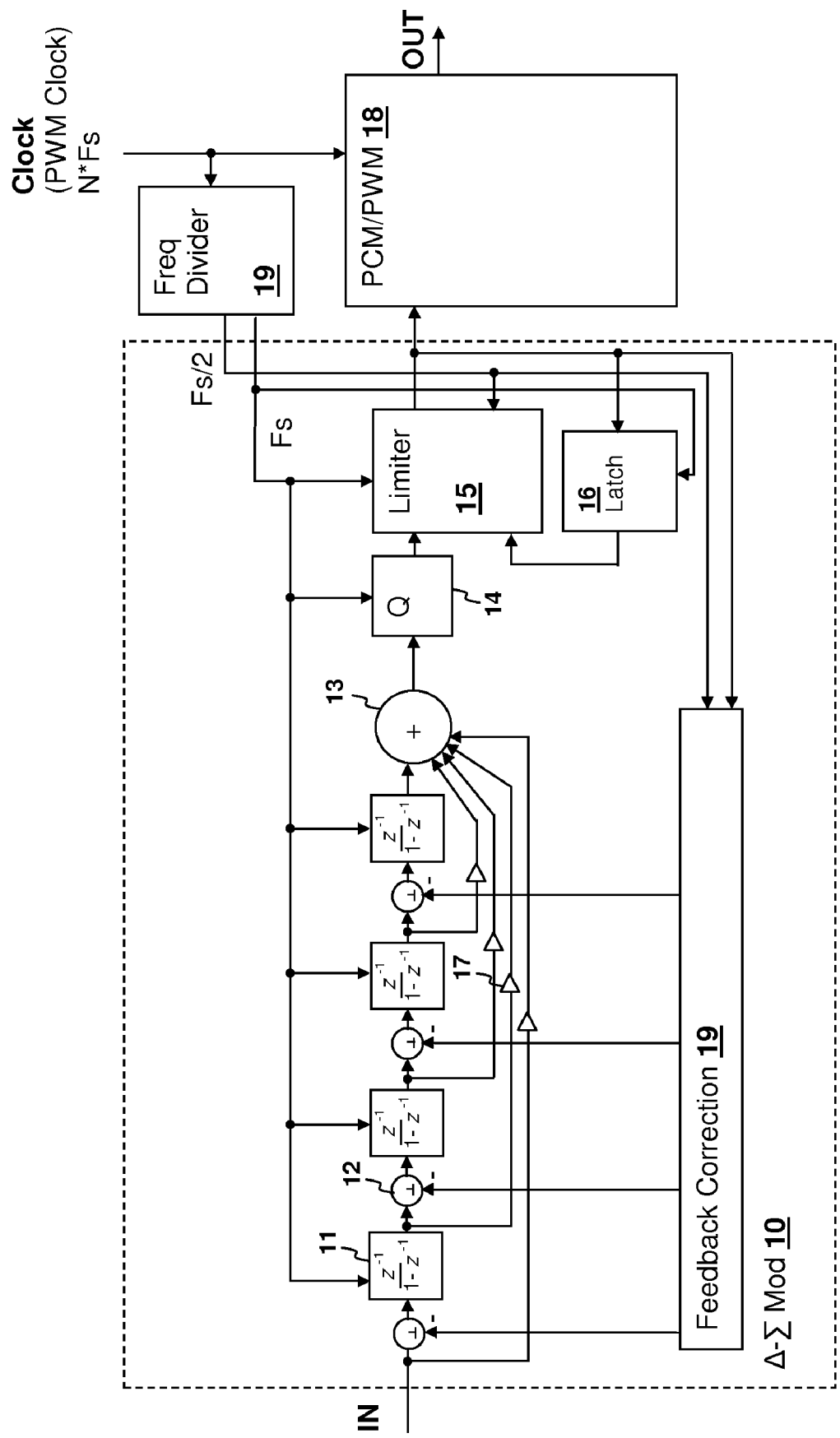
FIG. 1 is a block diagram depicting an apparatus in accordance with an embodiment of the present invention.

Referring now to FIG. 1, a circuit in accordance with an embodiment of the present invention is shown. A noise shaping delta-sigma modulator 10 has an input IN at a sample rate Fs for receiving a pulse generator input signal and provides a noise-shaped output at the same sample rate Fs that is supplied to a pulse generator implemented by a pulse width modulator (PWM)/pulse code modulator (PCM) 18. PCM/PWM 18 oversamples the output of delta-sigma modulator 10 by a factor of N, and is clocked by a PWM Clock signal at frequency N*Fs that is divided by a frequency divider 19 that produces the sample clock Fs and its division by two: Fs/2. The sample clock is applied to the internal integrators 11 that form the loop filter of delta-sigma modulator 10 as well as the quantizer 14. Thus, the sample rate into and out of delta-sigma modulator is at frequency Fs, while the PWM resolution or PCM cell rate is at frequency Fs*N, while the PWM pulse output rate is at frequency Fs/2, since two samples from quantizer 14 at frequency Fs are required to set the widths of the rising edge portion and falling edge portion of a PWM pulse. The structure of the filter preceding quantizer 14 is only exemplary and that the loop filter topology may be of different form or order.

Quantizer 14 has a number of output levels sufficient to support the oversampling rate N, so that at each quantizer 14 output sample, a pulse width of 0 to N clocks is produced. For purposes of illustration, N is chosen in the depicted embodiment as 100 so that pulse counts can be equated with a percentage (e.g., 0% to 100%) of the widths of the positive portion of a pulse portion within a total portion width of 100 counts, but generally N will be chosen as a power-of-two. For the rising edge portion of a pulse, the number of counts determines the positive width extending from the middle of the pulse and for the falling edge portion of the pulse, the number of counts determines the positive width of the pulse from the middle to the falling edge. PCM/PWM 18 implements a CEM, and is provided with the Fs/2 clock signal to toggle between generating rising and falling edge pulse portions. While in the illustrative embodiment, positive counts are used to illustrate pulse widths, any convention and implementation can be used such as assigning quantizer counts to the low-state pulse widths of the pulse portions. The duration of the positive portion of each pulse is normally determined by the quantizer sample for that portion. In the exemplary embodiment, for even samples out of quantizer 14, PCM/PWM generates a rising edge pulse portion and for odd samples out of quantizer 14, PCM/PWM generates a falling edge pulse portion. However, the present invention includes a limiter 15 that can override the output of quantizer 14 based on a previous pulse portion width history stored in latch 16 so that the PCM/PWM 18 is commanded to produce a minimum required pulse width corresponding to each interval either within the time period assigned to the pulse portion or in close proximity thereto.

The response of quantizer 14 and PCM/PWM 18 is such that for increasingly positive samples at the output of quantizer 14, PCM/PWM 18 generates increasingly early rising edges in the rising edge portion (REP) and increasingly delayed falling edges in the falling edge portion (FEP), with one quantizer sample per pulse portion. For rising edge portions (REP) of a pulse (odd samples of the output of quantizer 14), a highest count from quantizer 14 causes a minimum delay of the rising edge. For falling edge portions (FEP) of the pulse (even samples of the output of quantizer 14), a highest count from quantizer 14 causes a maximum delay of the falling edge. The lowest (or most negative) count from quantizer 14 yields an earliest falling edge in the FEP or a latest rising edge in the REP. PCM/PWM 18 can be implemented by a counter that is loaded with the quantizer sample, clocked by the Clock signal and the output of PCM/PWM 18 taken from a decode of the counter outputs, except when limiter 15 adjusts the delay of the rising edge portion of a pulse or extends the falling edge portion of the pulse in exception to the value commanded by the output of quantizer 14.

Delta-sigma modulator 10 implements a noise shaper using a series of integrator stages 11 that receives the input signal from the previous stage. The outputs of integrators 11 are combined with the output of a set of terms from a feedback correction block 19 that receives the output of delta-sigma modulator 10 and generates appropriate correction terms for each stage. The correction terms are alternated at each cycle of the sample clock in response to the Fs/2 clock signal. Scaling blocks 17 are provided to scale the outputs of integrators 11 for final summation by a combiner 13, but depending on the design of the delta-sigma modulator 10, scaling blocks 17 may not be needed in a particular design (if each term is unity) or the connections from each integrator output to combiner 13 will be absent completely for a feedback-only filter design. Quantizer 14 receives the combined output of the terms from each integrator 11 and the input signal IN.

While the term "signal" is used freely herein to describe various inputs and outputs connected between blocks and received and sent between the circuits described herein and external devices, the values are generally parallel digital numeric values that may be fixed or floating-point values. However, the concepts described and claimed herein have applicability to mixed-signal approaches, and the embodiments disclosed and claimed herein include analog signals with appropriate conversions when connected with digital blocks.

Limiter 15 generates exceptions to the output of quantizer 14 above-mentioned count values according to rules that govern the pulse borrowing. An example of pulse borrowing that permits the pulse width to extend from 0-100% of the pulse cycle is provided by enforcing the following conditions where REPP is the positive pulse width of the rising-edge portion (FEP) half of the Fs/2 period and FEPP is the positive pulse width of the falling-edge portion (FEP):

0<=FEPP<=100
0<=REPP<=100
REPP<=200−MinPWP−prior FEPP width
FEPP>=MinPWN−prior REPP width where MinPWP is the minimum positive (high-state) pulse width required for each pulse, MinPWN is the minimum negative (low-state) pulse width and where the numerical values correspond to the percentage of an Fs clock period. The above equations ensure that if a cycle is permitted to borrow time to permit either the low or high state of the OUT signal to reach a large value, that the minimum pulse widths will be enforced in the next pulse portion and/or do not violate the minimum pulse width because it was met in the previous pulse portion.

Figure 2:
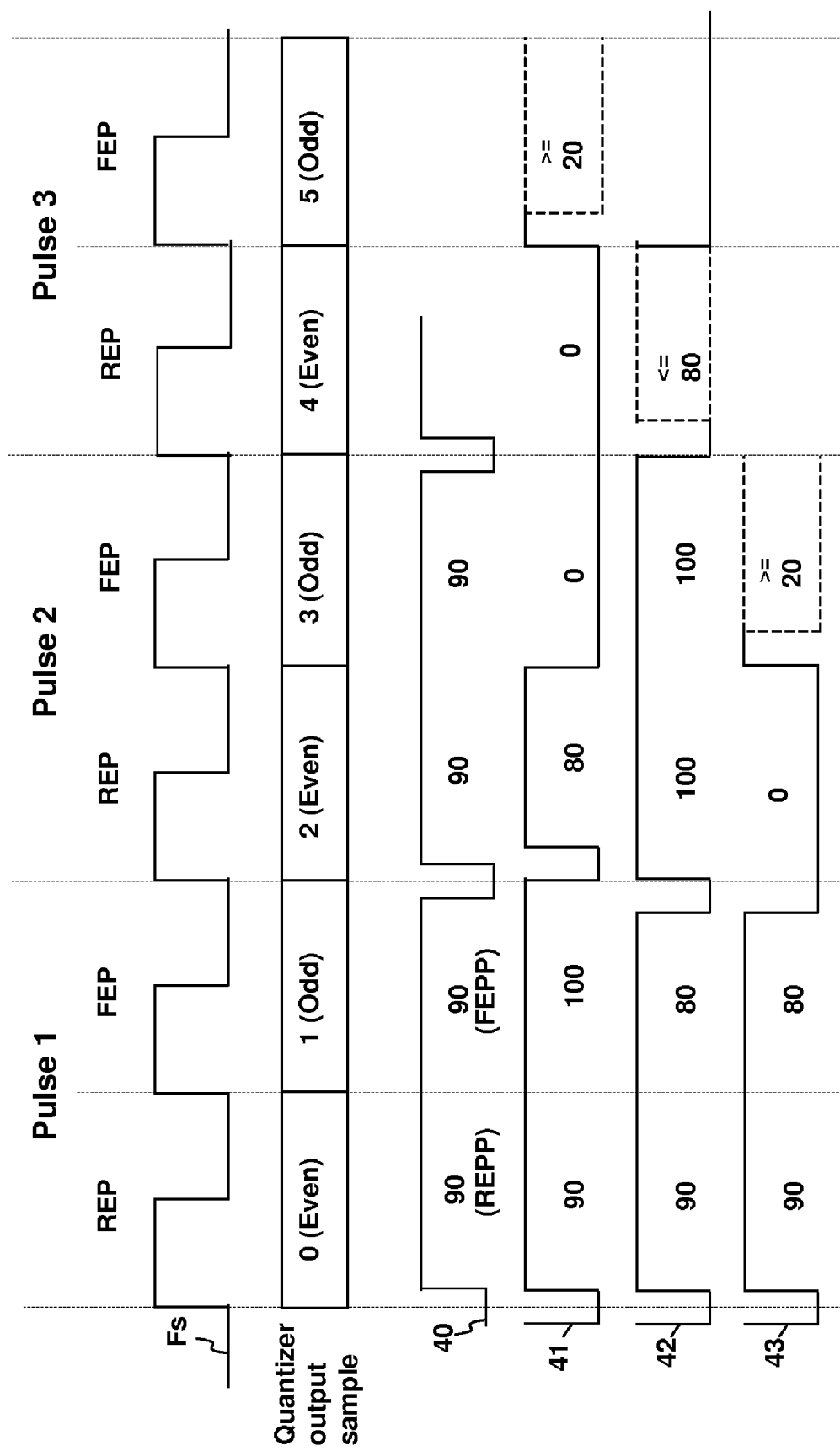
FIG. 2 is a timing diagram illustrating the operation of the circuit of FIG. 1.

Referring now to FIG. 2, operation of the above-described circuit is depicted in a timing diagram and contrasted to the operation of prior art circuits. Sample clock signal Fs is shown for reference. A prior art noise-shaped CEM modulator operates as shown in trace 40. When a maximum output from the noise-shaping quantizer is received continuously, a 90% positive pulse width is produced during both the rising edge portion and the falling edge portion of the pulse cycle. The depicted operation represents a constraint on the overall pulse duty factor to 90% (2*90=180 counts), or a minimum negative pulse width of 10% (2*10=20 counts). As mentioned above, such constraints are necessary to ensure a minimum time that devices are turned off (or on for the minimum on pulse width) in order to maintain linear operation and efficiency of a converter or power output stage employing the CEM.

Trace 41 shows a CEM modulator output in accordance with an embodiment of the present invention as described above with reference to FIG. 1. When a maximum quantizer output is received during the first depicted pulse cycle, the first REPP of 90 is remembered (stored in latch 16) and the FEPP is permitted to extend to 100. Next, a minimum low pulse width of 20 is generated due to the constraint that REPP<=2*N−MinPW−prior FEPP=200−20−100=20, where N is the maximum number of counts. Trace 42 shows operation when a maximum output from quantizer 14 is received after the first FEP has already started. The REPP is allowed to extend to 100, since the prior FEPP was 80 and the above-stated condition then yields 180−80=100. If the quantizer output is still at a high value, the next FEPP will also extend to 100, since the constraint above is only applied to REPP. During the REP of the next pulse, a minimum negative pulse of 20 (REPP<=80) will be produced due to the constraint that REPP<=180−100=80.

The rightmost portion of traces 41 and 42 show the corresponding cases for minimum values out of quantizer 14. In trace 41, when a minimum quantizer output is received after the second pulse REP, the modulator is permitted to drop the falling edge immediately (FEPP=0) since the constraint FEPP>=20-prior REPP yields 20-80=-60 and then the rising edge is also delayed by 100, yielding a REPP of 0, since there is no constraint on REPP for the negative pulse width. During the FEP of the last pulse cycle, a minimum FEPP of 20 is enforced by the constraint FEPP>=20-prior REPP=20-0=20. In trace 43, when a minimum quantizer output is received after the FEP of the first pulse has begun, in the second cycle the modulator is permitted to delay the rising edge by 100 (REPP=100) since the above minimum pulse width constraint does not apply, but for the FEP the constraint FEPP>=20-prior REPP yields 20-0=20, forcing an immediate rising edge at the beginning of the FEP and a minimum width of 20 for the FEPP.

It is possible to permit pulse portions to exceed 100 of the period, by extending the range of an edge corresponding to that portion into the next or previous pulse portion. In this "extreme borrowing" implementation, the minimum pulse width is still made up in the next pulse portion or by the prior pulse portion, but the length of the present pulse portion is permitted to extend into the next or previous pulse portion. For the positive pulse borrowing (corresponding to a high positive quantizer output), extension of the rising edge is made into the prior FEP, yielding early occurrence of the rising edge. Extension of the falling edge may also be made into the next REP, yielding a late occurrence (delay) of the falling edge. For negative pulse borrowing (corresponding to a minimum or negative quantizer output) delay of the rising edge is made into the next FEP and/or early occurrence of the falling edge is caused in the prior REP.

Figure 3:
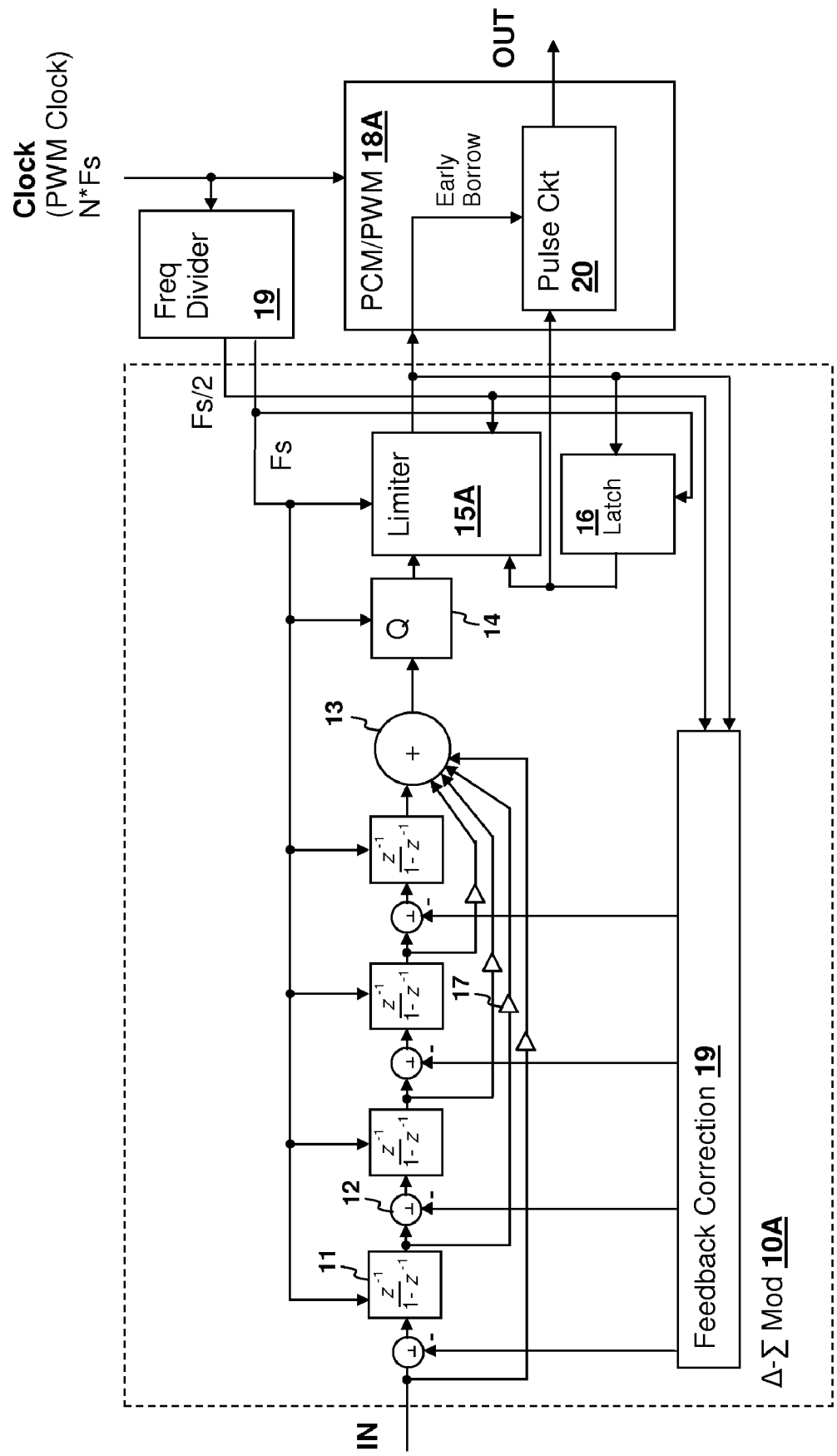
FIG. 3 is a block diagram depicting an apparatus in accordance with another embodiment of the present invention.

Referring now to FIG. 3, a circuit in accordance with another embodiment of the present invention is shown that permits such extreme borrowing. The circuit of FIG. 3 is similar in structure and operation to the circuit of FIG. 1 and therefore only differences between the two circuits will be described below. In the circuit of FIG. 3 a PCM/PWM 18A is included that has a pulse control circuit 20 that is responsive to both an output of a limiter 15A and a previously output stored in latch 16. Pulse control circuit 20 effectively delays the output of pulses by one pulse portion, permitting borrowing to occur from a present pulse that has a width controlled by the output of latch 16. An early borrow indication provided by the present output of limiter 15A provides for borrowing from the present pulse portion in conformity with the present output of limiter 15A that will be used to construct a next pulse portion. Limiter 15A differs from limiter 15 of FIG. 1, in that the pulse portion widths are permitted to extend above 100 and below 0, representing borrowing from a previous cycle or extending into a next cycle.

An exemplary set of control equations that permits borrowing of 10 percent from the next and previous pulse is:

-10<=FEPP<=110
-10<=REPP<=110
REPP<=200-MinPWP-prior FEPP
FEPP>=MinPWN-prior REPP Only the allowable ranges of FEPP and REPP differ from the previous example of FIGS. 1 and 2, as the limits on the maximum value of REPP and the minimum value of FEPP are the same as for the circuit of FIG. 1, due to the need to compensate for any borrowing past 100 percent of the pulse portion. Therefore, when an extreme value is borrowed, the following REP or previous FEP must supply the additional range.

Figure 4:
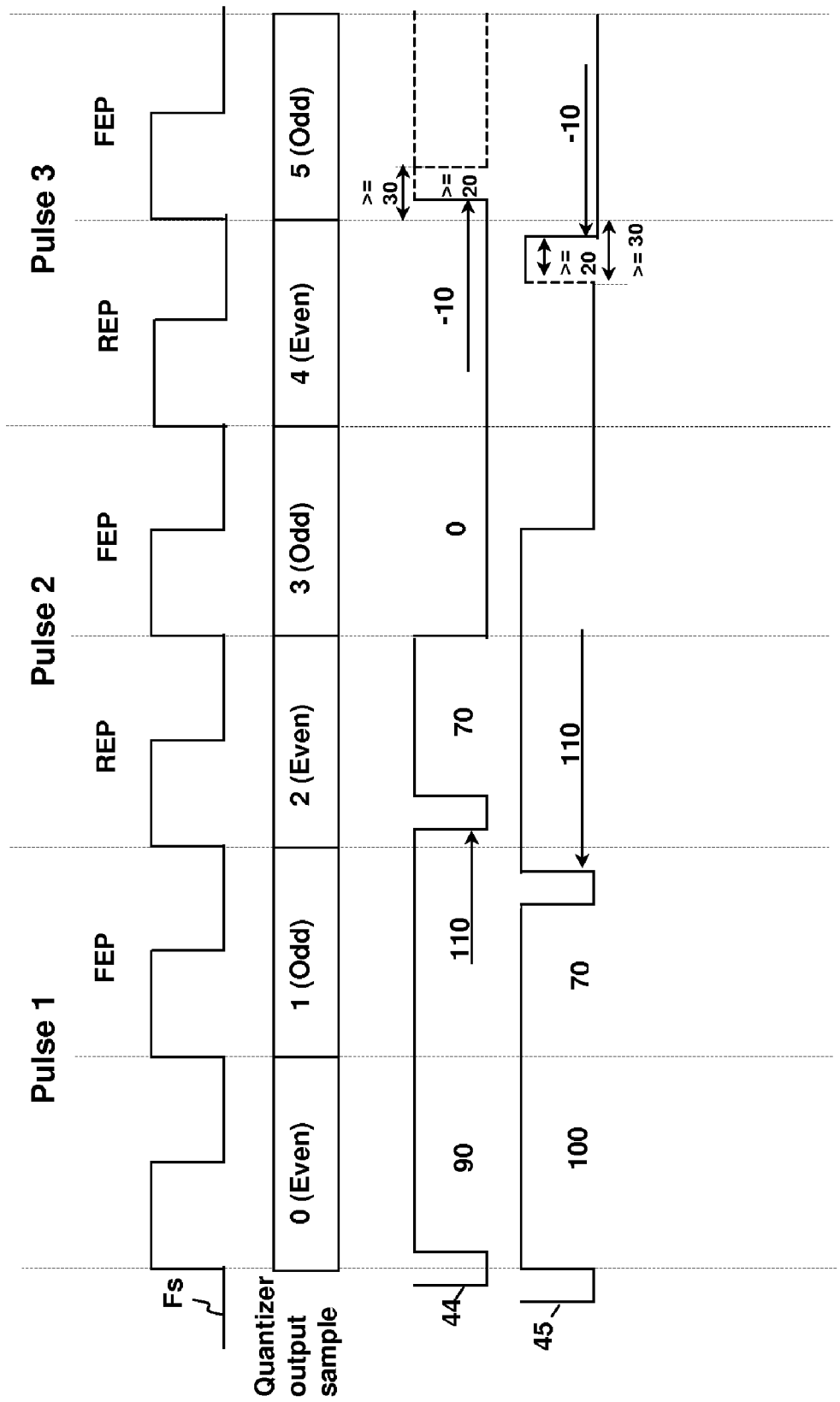
FIG. 4 is a timing diagram illustrating the operation of the circuit of FIG. 3.

Referring now to FIG. 4, operation of the circuit of FIG. 3 is shown. In trace 44, when a maximum quantizer output is received during the first cycle REP, the first REPP of 90 is remembered (stored in latch 16) and the FEPP is permitted to extend to 110 (into the next REP). Next, a generated minimum low pulse width of 20 is ensured by constraining the REPP to 70 or less, due to the constraint that REPP<=200-MinPW-prior FEPP=200-20-110<=70. Next, a low (negative) quantizer output value then causes the second FEPP have a 0 value, which generates an immediate falling edge and the next rising edge is delayed by 110, provided the quantizer output stays at a low/negative value. Ten cycles are borrowed from the third pulse FEP by this extension, which must be taken into account. The "extreme" borrowing is accounted for by setting the previous REPP to a value of -10. A minimum pulse width of 20 is next generated due to the criterion FEPP>=20-prior REPP width=20-(-10)=30, and since a count of 10 has already been borrowed, a minimum pulse width of 20 is generated since 10 cycles has already been removed from the FEPP of 30.

Trace 45 depicts extreme borrowing in which a maximum quantizer value is received prior to the second REP. The rising edge is asserted early (10 cycles back into the first FEP), "borrowing" from the first FEP by setting the currently-generated FEPP<=70, so that a minimum low pulse width is maintained. When the second REP is generated, the width (REPP) is extended to 100, resulting in an effective REPP of 110. The third pulse cycle of trace 45 illustrates extreme borrowing from the REP of the third pulse cycle. An early falling edge for a FEPP of -10 is permitted as long as FEPP>=20-prior REPP width where the prior REPP width is the commanded width (e.g., REPP can be truncated by 10 if the commanded width was greater than 30).

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A delta-sigma modulator circuit, comprising:
   a loop filter;
   a quantizer for quantizing an output of said loop filter;
   a limiter for limiting output values of said quantizer to a given range of values, and wherein an output of said limiter provides feedback to said loop filter; and
   a storage for storing a previous value of an output of said limiter, and wherein said storage is coupled to said limiter for adjusting said given range of values in conformity with said stored previous value.

2. The circuit of claim 1, further comprising a pulse modulating circuit having a modulation control input coupled to an output of said limiter, for generating pulses in conformity with said output of said limiter, wherein said adjusting of said given range of values ensures a minimum pulse width from said pulse modulating circuit.

3. The circuit of claim 2, wherein said pulse modulating circuit is a consecutive edge modulator.

4. The circuit of claim 1, wherein said quantizer is a multi-bit quantizer, wherein said output values of said quantizer have more than two distinct levels.

5. The circuit of claim 1, wherein said limiter has an input coupled to an output of said quantizer for receiving said output values from said quantizer.

6. The circuit of claim 1, wherein said limiter subtracts said stored previous value from a constant to determine an allowable value of said output of said limiter.

7. The circuit of claim 1, wherein said limiter adjusts said given range of values in conformity with said stored previous value, whereby additional dynamic range is provided at said output of said limiter in conformity with a previous margin between said stored previous value and said given range of values.

8. The circuit of claim 7, wherein said limiter further restores said given range of values to a previous range of values at a next sample of said quantizer.

9. The circuit of claim 7, wherein said limiter further adjusts said given range of values for limiting a next sample of said quantizer in an opposing direction to a previous adjustment in conformity with a value of a current sample of said quantizer.

10. A method of generating a limited noise-shaped digital output signal from an input signal, comprising:
noise-shaping said input signal with a loop filter;
quantizing a result of said noise-shaping;
limiting a result of said quantizing to a given range of values, and providing a limited result as feedback to said loop filter;
storing a previous value of a result of said limiting; and
adjusting said given range of values in conformity with said stored previous value.

11. The method of claim 10, further comprising generating pulses in conformity with said limited result, wherein said adjusting of said given range of values ensures a minimum pulse width from said generating.

12. The method of claim 11, wherein said generating generates pulses having rising and falling edges modulated in conformity with corresponding results of said limiting.

13. The method of claim 10, wherein said quantizing produces a multi-bit result, wherein said result of said quantizing has more than two distinct levels.

14. The method of claim 10, wherein said limiting is performed by a limiter that receives values from an output of a quantizer that performs said quantizing.

15. The method of claim 10, wherein said limiting subtracts said stored previous value from a constant to determine an allowable value of said limited result.

16. The method of claim 10, wherein said adjusting adjusts said given range of values in conformity with said stored previous value, whereby additional dynamic range is provided in said limited result in conformity with a previous margin between said stored previous value and said given range of values.

17. The method of claim 16, further comprising restoring said given range of values to a previous range of values prior a next performing of said quantizing.

18. The method of claim 16, further comprising next adjusting said given range of values for a next performing of said limiting in an opposing direction to said adjusting in conformity with a value of a current result of said quantizing.

19. A delta-sigma modulator circuit, comprising:
a loop filter;
a quantizer for quantizing an output of said loop filter;
a limiter having an input coupled to an output of said quanizer for limiting output values of said quantizer to a given range of values, and wherein an output of said limiter provides feedback to said loop filter; and
a storage for storing a previous value of an output of said limiter, and wherein said storage is coupled to said limiter for adjusting said given range of values in conformity with said stored previous value.

20. The delta-sigma modulator of claim 19, wherein said quantizer is a multi-bit quantizer, wherein said output values of said quantizer have more than two distinct levels.

* * * * *